United States Patent
Ramdani et al.

[19]

[11] Patent Number: 5,898,722
[45] Date of Patent: Apr. 27, 1999

[54] DUAL WAVELENGTH MONOLITHICALLY INTEGRATED VERTICAL CAVITY SURFACE EMITTING LASERS AND METHOD OF FABRICATION

[75] Inventors: Jamal Ramdani, Gilbert; Michael S. Lebby, Apache Junction; Wenbin Jiang, Phoenix, all of Ariz.

[73] Assignee: Motorola, Inc., Schaumburg, Ill.

[21] Appl. No.: 08/813,399

[22] Filed: Mar. 10, 1997

[51] Int. Cl.⁶ .................... H01S 3/10; H01S 3/19; H01S 3/08; H01L 21/20
[52] U.S. Cl. .................. 372/50; 438/34; 438/35; 372/23; 372/96
[58] Field of Search .................... 372/50, 23, 43, 372/45, 96; 438/32, 28, 34, 35

[56] References Cited

U.S. PATENT DOCUMENTS 5,319,655  6/1994  Thornton ..................... 372/23
5,699,375  12/1997  Paoli ........................ 372/50

FOREIGN PATENT DOCUMENTS 8-288585  11/1996  Japan .

*Primary Examiner*—Rodney Bovernick
*Assistant Examiner*—Quyen Phan Leung
*Attorney, Agent, or Firm*—Eugene A. Parsons; William E. Koch

[57] ABSTRACT

Dual wavelength monolithically integrated VCSELs and a method of fabrication for emitting a short wavelength light and a long wavelength light including a first mirror stack lattice matched to the surface of a substrate. A short wavelength VCSEL is fabricated and masked during the formation of a long wavelength VCSEL. Each VCSEL further including mirror pairs in a AlAs/AlGaAs material system, an active region lattice matched to a surface of the first mirror stack, and a second mirror stack lattice matched to a surface of the active region and capable of emitting either a short wavelength light or a long wavelength light, dependent upon design parameters. Electrical contacts are coupled to the active regions of the monolithically integrated short wavelength VCSEL and the long wavelength VCSEL. The dual wavelength monolithically integrated VCSELs fabricated as a semiconductor laser chip capable of read/write applications for both CDs and DVDs.

16 Claims, 3 Drawing Sheets

DUAL WAVELENGTH MONOLITHICALLY INTEGRATED VERTICAL CAVITY SURFACE EMITTING LASERS AND METHOD OF FABRICATION

FIELD OF THE INVENTION

This invention relates to vertical cavity surface emitting lasers and more specifically to the monolithic integration of a plurality of vertical cavity surface emitting lasers fabricated to emit light of different wavelengths.

BACKGROUND OF THE INVENTION

The rapid advancement of multimedia applications require a system that stores more information more compactly, and is easier to use and handle. Thus, digital video disc (DVD) technology offers this high density format advantage. DVD technology is based on a new generation of a compact disc format which provides for increased storage capacity and performance, especially for video and multimedia applications.

Compact disc (CD) technology is aggressively becoming the global standard for music, entertainment and computer software. Although extremely popular, CD technology has yet been able to provide high density formats. A compact disc (CD) can typically only store approximately five minutes worth of analog image information, and a larger size laser disc of 11.8 inches can store approximately sixty minutes of analog image information. Accordingly, while the movie/entertainment and computer industries want to pursue high density formats, such as that found in DVD technology, of concern is the maintenance of CD compatibility due to its appearance throughout the industry.

As the industry introduces this new digital technology, an increasingly important consideration is compatibility with the previous formats. Great effort has gone into making the DVD system, such as DVD-ROM, backward compatible. Backward compatibility includes the ability to play the existing CD format on a DVD system, while keeping in mind that there exist quite a few physical differences between a DVD system and a CD system. For instance, a DVD format disc has a pit length of 0.4 $\mu$m and a track pitch of 0.74 $\mu$m, almost half that of a CD format disc. In addition, the typical DVD substrate is 0.6 mm, in comparison to a typical CD substrate of 1.2 mm. The DVD laser wavelength is either 635 nm or 650 nm, and the DVD numerical aperture (NA) of the focal lens is 0.6, while the CD laser wavelength is typically 780 nm, and the CD NA of the focal lens is 0.45. These different parameters between DVDs and CDs lead to different laser requirements for read/write applications.

Several approaches have been proposed to solve the DVD backward compatibility issue. Among the solutions are an integrated two-lens switching system which consists of two lenses, one for CD, and the other for DVD, and a dual focus pickup system in which a single lens is used to achieve focus for both CD and DVD systems. With the integrated two-lens switching system, two lenses, one for the CD and the other for the DVD, are switched by rotating the lenses horizontally to read signals for each disc. With the dual-focus pickup system, a single lens can achieve focus for both the CD and the DVD without being realigned, and read the signals, due to the adoption of a hologram lens.

The two-lens system and the dual-focus lens system are complicated and difficult to make. Another technique is to use an LCD shutter to alter the characteristics of the laser used in reading the discs. The LCD shutter pickup is less complicated than the two-lens and dual-focus formats, resulting in a smaller, more reliable pickup. In this instance, the pickup is built using a 635 nm red laser. The LCD shutter changes the numerical aperture of the lens, producing a narrower beam, resulting in a longer focal distance of 1.2 mm into CDs, or a wider beam, resulting in a shorter focal distance of 0.6 mm into DVDs. This allows reading the two different formats with one pickup.

Although the LCD shutter pickup is an improvement to either the two-lens pickup system or the dual-focus lens pickup system, it is not an efficient use of the laser output power because the shutter blocks a significant amount of the laser power to narrow the beam width. In many instances, power efficiency is very important, such as in laptop computer applications. In addition the LCD shutter pickup requires extra circuitry to control the LCD shutter.

In general, longer wavelength lasers, such as 780 nm lasers, are widely used in low density compact disc (CD) read and write applications. This next generation of high density DVDs will require shorter wavelength lasers, such as 650 m or lower for read and write applications.

As previously described, vertical cavity surface emitting lasers (VCSELs) can potentially be utilized for these read and write applications and are capable of operating at a specific wavelength dependent upon the material system utilized in the fabrication process. In general, VCSELs include a first distributed Bragg reflector (DBR), also referred to as a mirror stack, formed on top of a substrate by semiconductor manufacturing techniques, an active region formed on top of the first mirror stack, and a second mirror stack formed on top of the active region. The VCSEL is driven by current forced through the active region, typically achieved by providing a first contact on the reverse side of the substrate and a second contact on top of the second mirror stack.

It would be highly advantageous to remedy the foregoing backward compatibility challenge and the deficiencies inherent in the prior art. Thus it is highly desirable and an object of the present invention to provide for a reading head, or optical pickup module, that incorporates both a short and a longer wavelength device. Accordingly, proposed is a low cost semiconductor chip that includes dual wavelength monolithically integrated VCSELs of different wavelengths, thereby capable of being utilized to read and write information to and from both CDs and DVDs, thus fulfilling the requirements of backward compatibility.

Another object of the invention is to provide a reliable semiconductor laser chip that incorporates a longer wavelength VCSEL, more particularly one emitting light of approximately 780 nm and a short wavelength VCSEL, more particularly one emitting light of approximately 635 to 650 nm, thereby capable of being utilized with both CDs and DVDs.

It is yet another object of the present invention to provide for efficient active regions and mirror stacks for use in a semiconductor chip that includes dual wavelength monolithically integrated VCSELs.

Still another object of the present invention is to provide for a method of fabricating dual wavelength monolithically integrated vertical cavity surface emitting lasers that includes both a longer wavelength VCSEL and a shorter wavelength VCSEL for use with both CDs and DVDs.

Yet another object of the invention is to reduce the complexity, thus cost, of monolithically integrating a long wavelength VCSEL and a shorter wavelength VCSEL.

SUMMARY OF THE INVENTION

Briefly, to achieve the desired objects of the instant invention in accordance with a preferred embodiment thereof, provided is a semiconductor laser chip including a first vertical cavity surface emitting laser, generating a short wavelength light emission and a second vertical cavity surface emitting laser, monolithically integrated with the first vertical cavity surface emitting laser, and generating a light emission of a wavelength longer than the wavelength of the first vertical cavity surface emitting laser.

In addition, included is a method of fabricating monolithically integrated vertical cavity surface emitting lasers including providing a substrate having formed thereon a first mirror stack. Fabricating a first vertical cavity surface emitting laser on the first mirror stack and fabricating a second vertical cavity surface emitting laser on the first mirror stack, spaced apart from the first vertical cavity surface emitting laser. The second vertical cavity surface emitting laser fabricated to generate an emission of a wavelength longer than that of the first vertical cavity surface emitting laser.

BRIEF DESCRIPTION OF THE DRAWINGS

The novel features believed characteristic of the invention are set forth in the claims. The invention itself, however, as well as other features and advantages thereof will be best understood by reference to detailed descriptions which follow, when read in conjunction with the accompanying drawings, wherein:

DETAILED DESCRIPTION OF THE DRAWINGS

Figure 1:
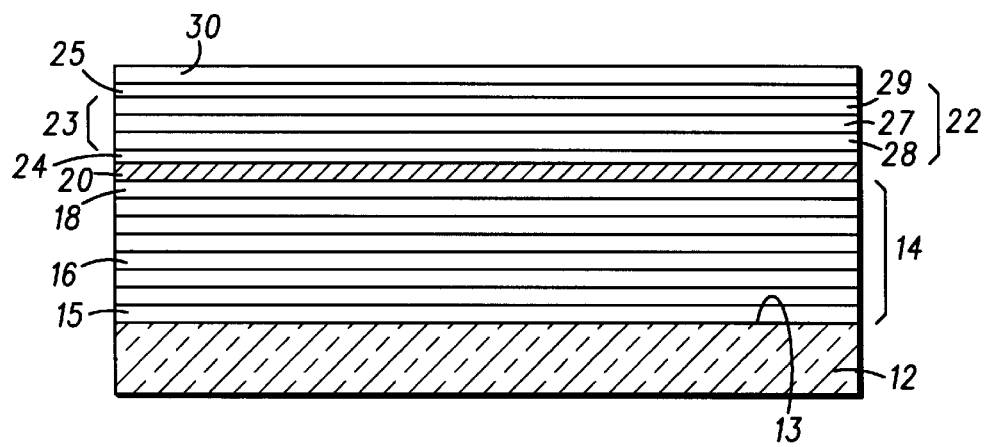
FIG. 1 is a sectional view of a short wavelength VCSEL fabricated on a substrate element in accordance with the present invention.

Turning now to the drawings in which like reference characters indicate corresponding elements throughout the several views, attention is first directed to FIG. 1 which illustrates a short wavelength vertical cavity surface emitting laser (VCSEL) generally designated 10. VCSEL 10 is formed on a substrate 12, which in this specific embodiment, is GaAs. GaAs is preferably used to facilitate lattice matching of the components of VCSEL 10 which emits light of a short wavelength, more particularly light of approximately 635 to 650 nm. It should be understood that GaAs is only utilized as an example and other semiconductor materials may be employed as substrate 12.

Substrate 12 has an upper surface 13 on which a mirror stack 14 is disposed. Mirror stack 14 includes a plurality of mirror pairs in a AlAs/Al$_{0.5}$GaAs material system, more particularly illustrated are alternating layers of AlAs 15 and AlGaAs 16. It should be understood that substrate 12 and mirror stack 14 will be utilized in both the fabrication of the short wavelength VCSEL and the monolithically integrated longer wavelength VCSEL. Positioned on a last layer of mirror stack 14 is a layer 18 of n-doped Al$_{0.5}$GaAs. Layer 18 will serve as a bottom contact layer for both the short wavelength VCSEL and the monolithically integrated longer wavelength VCSEL.

There is disposed on a surface of layer 18, a thin layer 20 of highly n-doped GaAs. Layer 20 is formed approximately 50 Å thick and serves as protection for layer 18 from the process environments. An active region 22 composed of an AlInP/AlGaInP/InGaP material system is disposed on GaAs layer 20. Active region 22 includes an active structure 23 sandwiched between a first cladding region 24 adjacent AlGaAs layer 20 and a second cladding region 25.

Mirror stack 14 is formed by depositing pairs of layers on substrate 12 in some convenient technique such as molecular beam epitaxy (MBE), metal-organic chemical vapor deposition (MOCVD) or sputtering. In order to crystal lattice match mirror stack 14 to substrate 12 a suitable semiconductor material system must be deposited. Approximately 4–6 mirror pairs of this material system are deposited on substrate 12 depending on the difference between the refractive indices of the layers. It should be understood that AlAs layer 15 will be oxidized as described presently. This material system is capable of providing a difference in indices of refraction between layers 15 and 16 in a range of 1.5 to 1.6. This difference in the refractive index is large enough to achieve sufficient reflectance of DBR mirror stack 14. It should be understood that these materials can be grown with excellent quality.

Cladding region 24 includes one or more layers which may be graded if necessary for better carrier confinement. In this specific embodiment, cladding region 24 is formed of an AlInP material system.

With additional reference to FIG. 1, active structure 23, in this embodiment, includes one quantum well layer 27, sandwiched between barrier layers 28 and 29. For example quantum well layer 27 and barrier layers 28 and 29 are each approximately 100 Å thick, with the total thickness of active region 20 being one wavelength of the emitted light or a multiple thereof. Quantum well layer 27 is preferably formed of InGaP and barriers layers 28 and 29 are preferably formed of AlGaInP. One skilled in the art will understand that more quantum well layers and barrier layers can be used depending upon the application. Active region 22 is configured to emit light with a wavelength in a range of approximately 635 to 650 nm.

Cladding region 25 includes one or more layers which may be graded if necessary for better carrier confinement. In this specific embodiment, cladding region 25 is formed of a AlInP material system. Layer 30 of GaAs is fabricated approximately 50 Å thick and serves as a protective layer for the InAlP cladding region 25.

Figure 2:
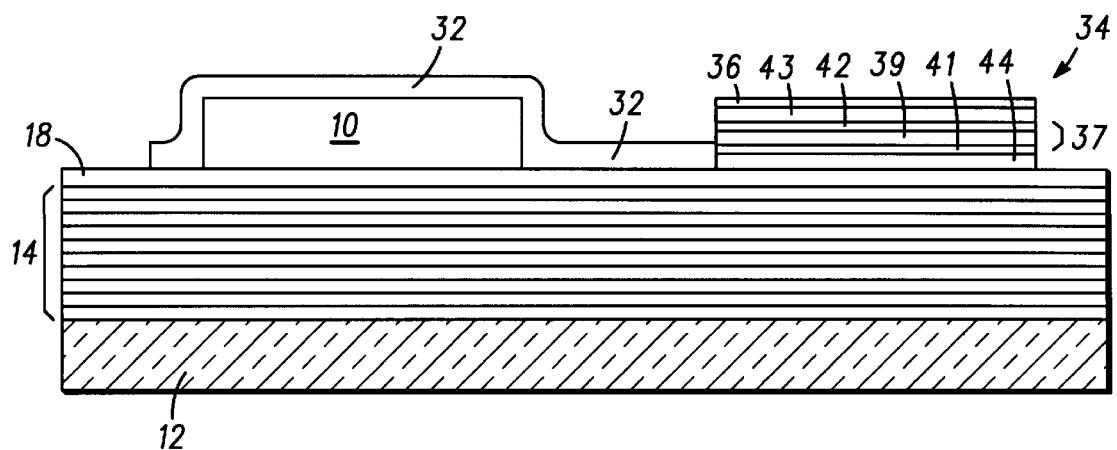
FIG. 2 is a sectional view illustrating a step in the method of fabricating monolithically integrated vertical cavity surface emitting lasers including a short wavelength VCSEL and a longer wavelength VCSEL in accordance with the present invention.

Referring now to FIG. 2, illustrated in sectional view is a step in the method of fabricating monolithically integrated vertical cavity surface emitting lasers including a short wavelength VCSEL and a longer wavelength VCSEL in accordance with the present invention. More particularly, illustrated is VCSEL 10 of FIG. 1 masked by an SiO$_2$ layer 32. A selective etch down to the GaAs layer 20 is carried out to allow for the formation of a monolithically integrated long wavelength VCSEL, in this particular embodiment a 780 nm VCSEL 34. VCSEL 34 is fabricated generally similar to VCSEL 10 described with regard to FIG. 1, except in this particular embodiment of long wavelength VCSEL 34, an active region 35 is selectively grown from an $Al_{0.1}Ga_{0.9}As/Al_{0.4}Ga_{0.6}As/Al_{0.6}Ga_{0.4}As$ material system, thereby emitting in a longer wavelength in a range of 750 to 830 nm. The total thickness of active region 35 being one wavelength of the emitted light or a multiple thereof. More particularly, active region 35 is composed of an active structure 37 sandwiched between a plurality of cladding regions 43 and 44. Active structure 37 is composed of at least one quantum well 39 including an AlGaAs material, and a plurality of barrier layers 41 and 42 composed of an AlGaAs material. One skilled in the art will understand that more quantum well layers and barrier layers can be used depending upon the application. The active region 35 is then followed by a thin 50 Å p-doped GaAs protective layer 36.

Figure 3:
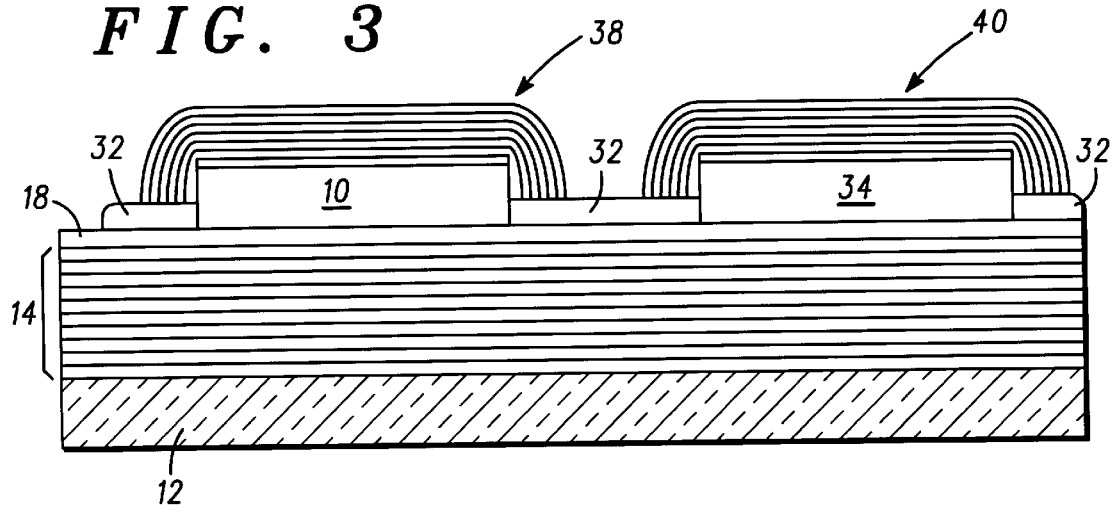
FIG. 3 is a sectional view illustrating a step in the method of fabricating monolithically integrated vertical cavity surface emitting lasers, more particularly the deposition a second mirror stack on the short wavelength VCSEL and the longer wavelength VCSEL.

Referring now to FIG. 3, once VCSEL 10 and VCSEL 34 are fabricated to the above described stages, the $SiO_2$ masking layer 32 is selectively removed, leaving in place that portion of layer 32 that resides between VCSEL 10 and VCSEL 34. Next, top DBR mirror stacks 38 and 40 are grown on a surface of layer 30 and layer 36 of VCSEL 10 and VCSEL 34, respectively. Mirror stack 38 and 40 are formed by depositing pairs of alternating layers on layers 30 and 36, respectively, using some convenient technique such as molecular beam epitaxy (MBE), metal-organic chemical vapor deposition (MOCVD), or sputtering. Top mirror stacks 38 and 40 are fabricated from an $AlAs/Al_{0.5}$ GaAs material system and composed of approximately 3–5 mirror pairs. Once DBR mirror stacks 38 and 40 are fabricated, the two devices 10 and 34, are isolated by etching through to an uppermost surface of first DBR mirror stack 14, with the remainder of the $SiO_2$ layer being removed.

The AlAs layers of mirror stacks 14, 38 and 40 of devices 10 and 34 are oxidized to convert them to $Al_2O_3$. The reflectance of the separate mirror pairs now composed of $Al_2O_3/Al_{0.5}GaAs$ allow for sufficient index differences, thus achievement of greater reflectance.

Figure 4:
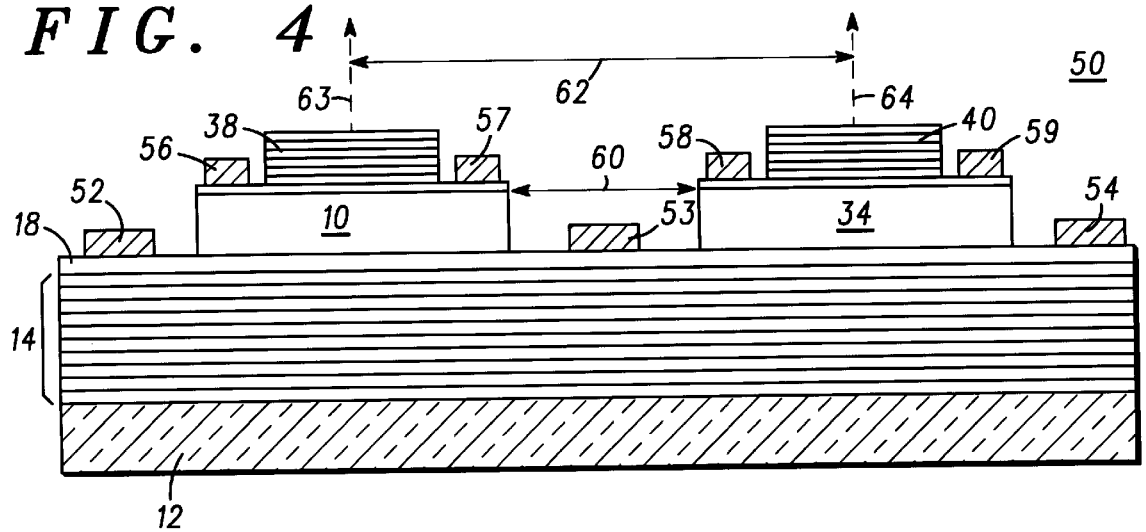
FIG. 4 is a sectional view illustrating the complete semiconductor laser device including the monolithically integrated short wavelength VCSEL and longer wavelength VCSEL in accordance with the present invention.

Referring now to FIG. 4 illustrated in simplified sectional view is a complete semiconductor laser chip 50, including dual wavelength monolithically integrated VCSELs 10 and 34, according to the present invention. Laser chip 50 is composed of short wavelength VCSEL 10 and long wavelength VCSEL 34 and a plurality of contacts (discussed presently). Once the final etching and isolation to define the devices 10 and 34 are complete (previously described) a plurality of electrical contacts are positioned to complete device 50. More specifically, bottom contacts 52, 53, and 54, made of gold, aluminum, or any other suitable conductive metal, are positioned on an uppermost surface of layer 18. In this embodiment layer 18 is heavily doped to provide a conductive layer and electrical contacts 52, 53, and 54 are positioned on a surface thereof around the periphery of the active structures of devices 10 and 34. Top contacts 56, 57, 58, and 59, made of gold, aluminum, or any other suitable conductive metal, are positioned on and uppermost surface of layers 30 and 36 of devices 10 and 34, respectively. Layers 30 and 36 are heavily doped to provide a conductive layer and the contacts 56, 57, 58, and 59 are positioned on a surface thereof around the periphery of mirror stacks 38 and 40. During operation of semiconductor laser chip 50, VCSELs 10 and 34 are driven by a current forced through the active structures of devices 10 and 34 through contacts 52, 53, 54, 56, 57, 58, and 59 dependent upon the operation of a desired wavelength VCSEL. VCSEL device 10 and VCSEL device 34 are separated by a space 60, which in this particular embodiment is approximately 10 µm. The spacing between the emission of light 63 from short wavelength VCSEL 10 and the emission of light 64 from long wavelength VCSEL 34 in this particular embodiment is less than 75 µm. This spacing allows for operation and proper focus of short wavelength laser emission 63 or long wavelength laser emission 64 dependent upon the reading and/or writing to or from a CD or high density DVD by sharing the same optical lens system. It should be understood that the spacing identified is utilized for purposes of describing this particular embodiment and that the actual spacing between the two devices can be adjusted dependent upon design requirements.

Figure 5:
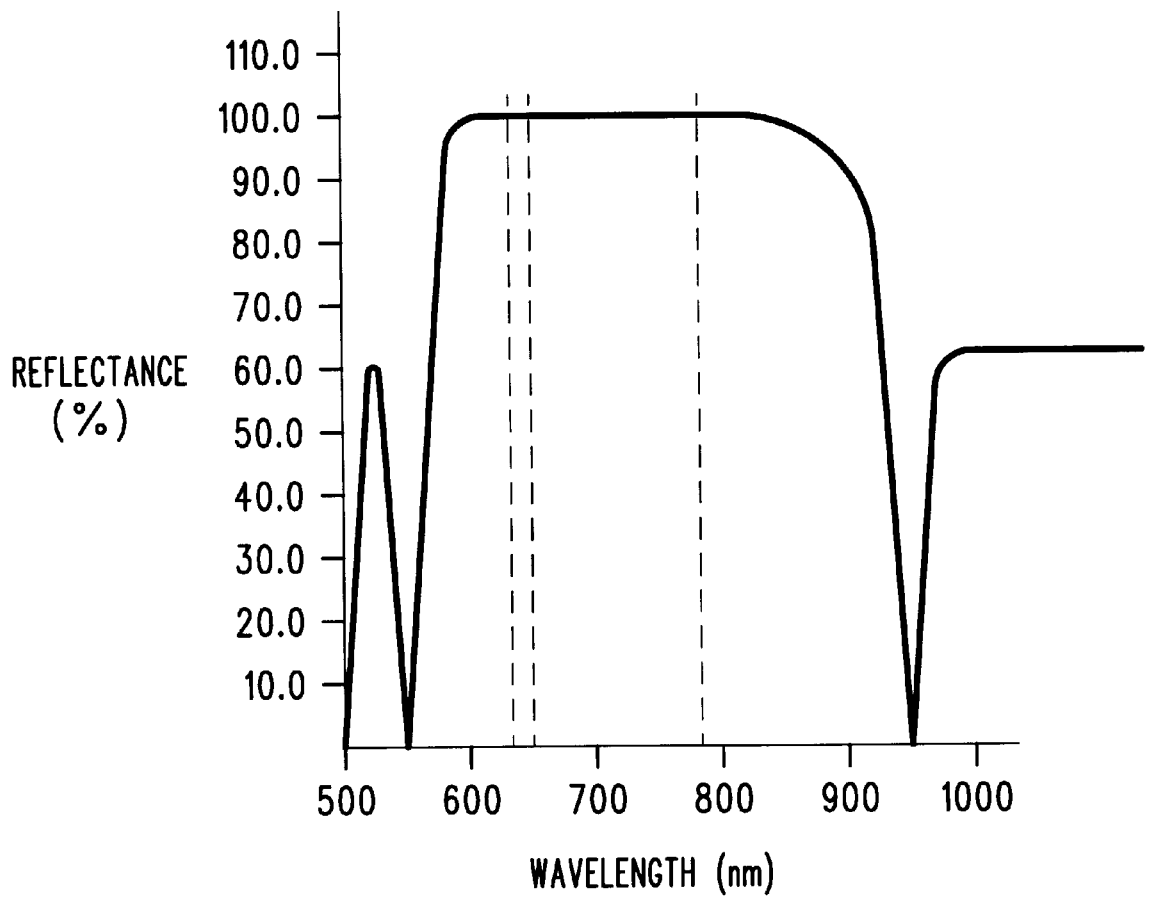
FIG. 5 is a graphical representation showing the percentage of reflectance in comparison to the wavelength of light achieved by the semiconductor laser chip of the present invention.

Referring now to FIG. 5, illustrated is a graphical representation of the percentage of reflectance achieved by mirror stacks 14, 38 and 40 in comparison to the wavelength of light. As illustrated, a nearly 100% reflectance of the oxidized mirror stacks 14, 38 and 40 is achieved for both the short wavelength, 635 and 650 nm VCSEL 10 and the longwavelength, 780 nm VCSEL 34.

Thus, disclosed is the monolithic integration of different wavelength vertical cavity surface emitting lasers in a single semiconductor laser chip, that can be utilized as a reading head for both CD and DVD applications. This monolithic integration of two VCSELs, with different wavelengths, more particularly a 635 to 650 nm VCSEL and a 780 nm VCSEL, allows for the achievement of an appropriate beam spot size and focal distance to read/write for both CDs and DVDs. In addition, the monolithic integration of two different wavelength VCSELs allows for a decrease in the complexity of the design and cost of a laser head and overcomes the challenges presented in achieving backward compatibility. When a CD needs to be read, the 780 nm VCSEL 34 is switched on. Accordingly, the laser beam is focused into the CD substrate of 1.2 mm. When a DVD needs to be read, the 635 to 650 nm laser is switched on and the laser beam is focused into the DVD substrate of 0.6 mm.

Various changes and modifications to the embodiment herein chosen for purposes of illustration will readily occur to those skilled in the art. For example, it should be understood that the VCSEL structures symmetry exists for both the p and n dopents as well as electrically inverted structure designs. To the extent that such modifications and variations do not depart from the spirit of the invention, they are intended to be included within the scope thereof which is assessed only by a fair interpretation of the following claims. It should be noted that throughout the figures, all similar components are designated with similar numbers.

The various steps of the method disclosed have been performed in a specific order for purposes of explanation, however, it should be understood that various steps of the disclosed method may be interchanged and/or combined with other steps in specific applications and it is fully intended that all such changes in the disclosed methods come within the scope of the claims.

While we have shown and described specific embodiments of the present invention, further modifications and improvement will occur to those skilled in the art. We desire it to be understood, therefore, that this invention is not limited to the particular forms shown and we intend in the appended claims to cover all modifications that do not depart from the spirit and scope of this invention.

What is claimed is:

1. A semiconductor laser chip comprising:
   a first vertical cavity surface emitting laser fabricated on a substrate element, the first vertical cavity surface emitting laser including a single active region and configured to emit light with a wavelength in a range of approximately 750–830 nm; and a second vertical cavity surface emitting laser fabricated on the substrate element and monolithically integrated with the first vertical cavity surface emitting laser by sharing a first DBR mirror stack, the second vertical cavity surface emitting laser including a single active region different than the active material of the first vertical cavity surface emitting laser and configured to emit light with a wavelength in a range of approximately 635 to 670 nm.

2. A semiconductor laser chip as claimed in claim 1 wherein the substrate element is a GaAs substrate element.

3. A semiconductor laser chip as claimed in claim 1 wherein the substrate element has formed thereon an uppermost surface, the first DBR mirror stack.

4. A semiconductor laser chip as claimed in claim 3 wherein the first DBR mirror stack includes alternating layers of an AlAs material and an AlGaAs material.

5. A semiconductor laser chip as claimed in claim 1 wherein the single active region of the first vertical cavity surface emitting laser is an InGaP/AlGaInP/AlInP material system.

6. A semiconductor laser chip as claimed in claim 5 wherein the single active region of the second vertical cavity surface emitting laser is an $Al_{0.1}Ga_{0.9}As/Al_{0.4}Ga_{0.6}As/Al_{0.6}Ga_{0.4}As$ material system.

7. A semiconductor laser chip as claimed in claim 1 wherein the first vertical cavity surface emitting laser includes a second DBR mirror stack disposed on the active region of the first vertical cavity surface emitting laser and the second vertical cavity surface emitting laser includes a second DBR mirror stack disposed on the active region of the second vertical cavity surface emitting laser.

8. Dual wavelength monolithically integrated vertical cavity surface emitting lasers comprising:

a substrate element having a surface;

a first DBR mirror stack disposed on the surface of the substrate element;

a first active region including a single active material disposed on the surface of a portion of the first DBR mirror stack and a second DBR mirror stack disposed on a surface of the first active region, a portion of the first DBR mirror stack, the first active region including a single active material and the second DBR mirror stack forming a first vertical cavity surface emitting laser generating an emission along a path and configured to emit light with a wavelength in a range of approximately 635–650 nm; and a second active region including a single active material different than the single active material of the first active region, the second active region disposed on the surface of another portion of the first DBR mirror stack and a second DBR mirror stack disposed on a surface of the second active region, the second active region and the second DBR mirror stack laterally spaced apart from the first vertical cavity surface emitting laser, the portion of the first DBR mirror stack, the second active region and the second DBR mirror stack forming a second vertical cavity surface emitting laser generating an emission along a path and configured to emit light with a wavelength in a range of approximately 750–830 nm.

9. Dual wavelength monolithically integrated vertical cavity surface emitting lasers as claimed in claim 8 wherein the first active region including a single active material includes at least one InGaP quantum well and a plurality of AlGaInP barrier layers.

10. Dual wavelength monolithically integrated vertical cavity surface emitting lasers as claimed in claim 9 wherein the active region of the second vertical cavity surface emitting laser includes at least one $Al_{0.1}Ga_{0.9}As$ quantum well and a plurality of $Al_{0.4}Ga_{0.6}As$ barrier layers.

11. Dual wavelength monolithically integrated vertical cavity surface emitting laser as claimed in claim 8 wherein the path of emission of the first vertical cavity surface emitting laser and the path of emission of the second vertical cavity surface emitting laser are spaced apart approximately 75 $\mu$m or less.

12. A method of fabricating a semiconductor laser chip including the steps of:

providing a substrate having formed thereon a first mirror stack;

disposing a first active region, including a single active material, on the first mirror stack;

disposing a masking layer on a portion of the first active region and selectively etching through a remaining portion of the first active region to expose a portion of the first mirror stack;

disposing a second active region, including a single active material different than the active material of the first active region, on the exposed portion of the first mirror stack;

selectively removing the masking layer disposed on the first active region;

disposing a second mirror stack on the first active region, the first mirror stack, the first active region and the second mirror stack disposed on the first active region defining a first vertical cavity surface emitting laser configured to emit short wavelength light; and disposing a second mirror stack on the second active region, the first mirror stack, the second active region and the second mirror stack disposed on the second active region defining a second vertical cavity surface emitting laser laterally spaced apart from the first vertical cavity surface emitting laser, the second vertical cavity surface emitting laser configured to emit light of a longer wavelength than the first vertical cavity surface emitting laser.

13. A method of fabricating a semiconductor laser chip as claimed in claim 12 wherein the step of disposing the first active region includes disposing a plurality of barrier layers in an AlGaInP material system and at least one quantum well in a InGaP material system.

14. A method of fabricating a semiconductor laser chip as claimed in claim 13 wherein the first mirror stack, the first active region and the second mirror stack of the first vertical cavity surface emitting laser are configured to emit light with a wavelength in a range of approximately 635 to 650 nm.

15. A method of fabricating a semiconductor laser chip as claimed in claim 12 wherein the step of disposing the second active region includes disposing a plurality of barrier layers in a AlGaAs material system and at least one quantum well in a AlGaAs material system.

16. A method of fabricating a semiconductor laser chip as claimed in claim 15 wherein the first mirror stack, the second active region and the second mirror stack of the second vertical cavity surface emitting laser are configured to emit light with a wavelength in a range of approximately 750 to 830 nm.

* * * * *